United States Patent [19]
Boehm et al.

[11] Patent Number: 4,779,732
[45] Date of Patent: Oct. 25, 1988

[54] CONTAINER FOR A PLURALITY OF DISK-SHAPED ARTICLES AND CONTAINER PART THEREOF

[75] Inventors: Udo Boehm, Ludwigshafen; Dieter Schaefer, Lindenberg; Adam Weber, Ludwigshafen, all of Fed. Rep. of Germany

[73] Assignee: BASF Aktiengesellschaft, Ludwigshafen, Fed. Rep. of Germany

[21] Appl. No.: 883,694

[22] Filed: Jul. 9, 1986

[51] Int. Cl.$^4$ .............................................. B65D 85/48
[52] U.S. Cl. .................................. 206/454; 206/328; 206/334
[58] Field of Search ............... 206/309, 444, 445, 328, 206/329, 330, 331, 332, 333, 334, 454, 455, 509; 220/4 B, 4 E, 4 F, 4 R; 211/41

[56] References Cited

U.S. PATENT DOCUMENTS

| | | | |
|---|---|---|---|
| 4,023,691 | 5/1977 | Perel | 206/454 X |
| 4,043,451 | 8/1977 | Johnson | 206/334 |
| 4,061,228 | 12/1977 | Johnson | 206/334 |
| 4,069,938 | 1/1978 | Palte et al. | 220/4 F X |
| 4,079,835 | 3/1978 | Kendig | 220/4 B X |
| 4,101,027 | 7/1978 | Kohl et al. | 206/309 |
| 4,248,346 | 2/1981 | Johnson | 206/454 |
| 4,349,147 | 9/1982 | Jensen | 206/509 |
| 4,450,960 | 5/1984 | Johnson | 206/334 |
| 4,478,156 | 10/1984 | Andersson | 206/509 X |
| 4,520,925 | 6/1985 | Johnson | 206/454 X |
| 4,557,382 | 12/1985 | Johnson | 206/444 |
| 4,566,839 | 1/1986 | Butler | 206/454 |
| 4,585,122 | 4/1986 | Stegenga | 220/4 E X |
| 4,588,086 | 5/1986 | Coe | 206/309 X |
| 4,669,612 | 6/1987 | Mortensen | 206/454 |
| 4,687,097 | 8/1987 | Mortensen | 206/334 |
| 4,718,549 | 1/1988 | Rissotti et al. | 206/328 |

FOREIGN PATENT DOCUMENTS

86/00746  1/1986  PCT Int'l Appl. ............. 33/4

Primary Examiner—David T. Fidei
Attorney, Agent, or Firm—Keil & Weinkauf

[57] ABSTRACT

In a container for a plurality of disk-shaped articles, the partly opened base portion possessing receiving grooves consists of two substantially identical parts which can be assembled, and two further, substantially identical cover parts which at least partially close the openings, and means are provided for disengageably locking the parts of the base portion to the cover parts. Interlocking stacking means are used for stacking a plurality of the base parts, with or without cover parts. The container of the parts of the base portion are useful for any transportation and archiving purposes during production of the articles or by their end users.

20 Claims, 9 Drawing Sheets

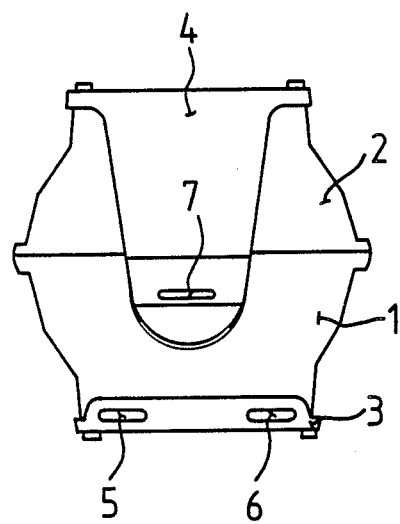
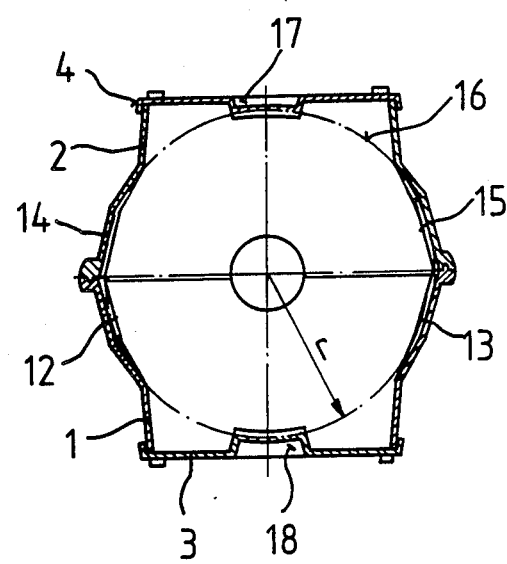
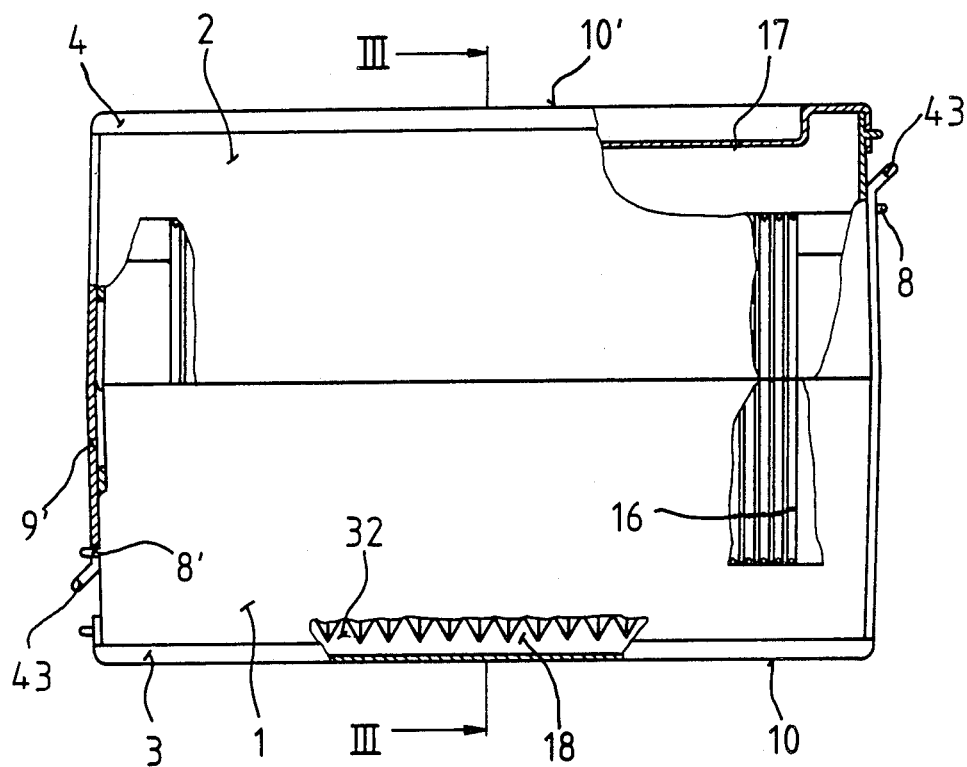

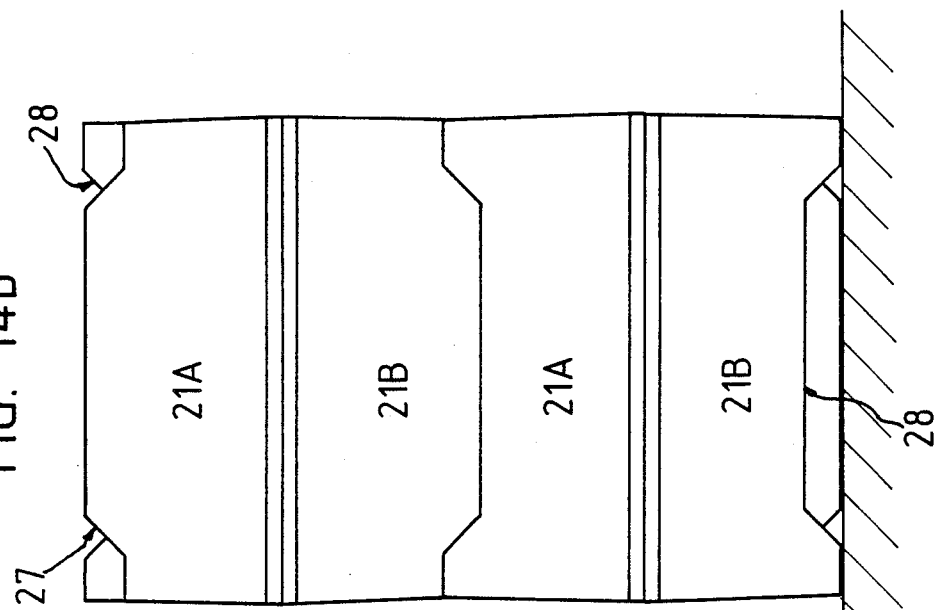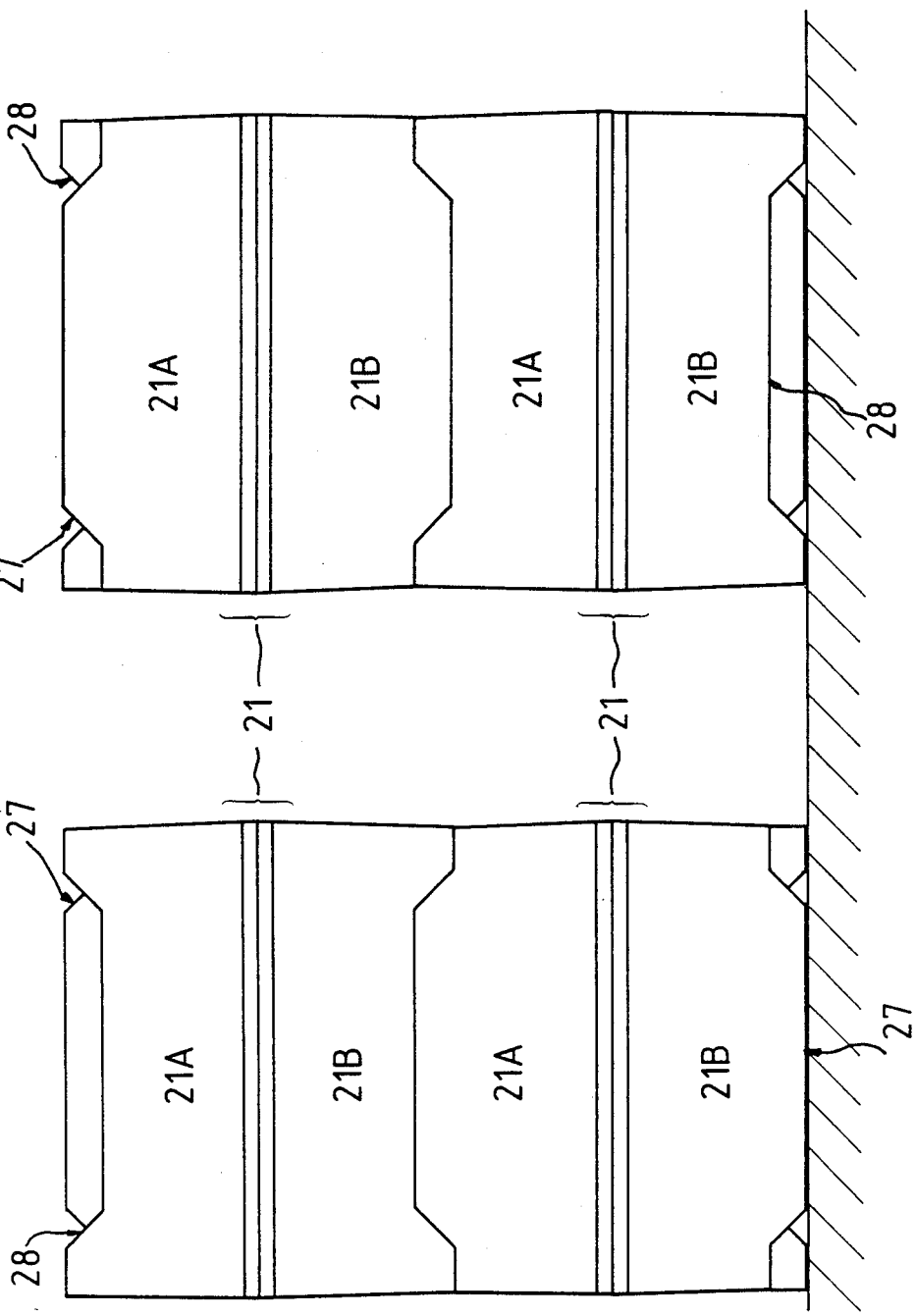

CONTAINER FOR A PLURALITY OF DISK-SHAPED ARTICLES AND CONTAINER PART THEREOF

BACKGROUND OF THE INVENTION AND PRIOR ART

The present invention relates to a container for a plurality of disk-shaped articles, in particular recording media, consisting of a base portion consisting of two at least substantially similar parts and which is provided with at least two openings and possesses a plurality of receiving grooves for the articles, and of at least one cover portion and of disengageable locking means provided between the base portion and the at least one cover portion. The invention also relates to a container part for such a container.

A known container of the kind referred to, for disks, consists of a box which can be closed by means of a cover and contains a plurality of parallel grooves whose internal width corresponds to the width of a data storage disk and which also have the other dimensions of the data storage disks. The container has two or more thin elastically deformable projections which are separated from one another, project into the container and extend transversely with respect to the direction of the grooves over the entire area in which grooves are present. When data storage disks are placed in the container the grooves fit closely against the disks at two or more points displaced relative to one another in the peripheral direction (German Laid-Open Application DOS No. 3 429 244 corresponding to U.S. Pat. No. 4,557,382).

In this known container, the disks can be protected from becoming soiled and from mechanical damage. The grooves present in this container keep the disks spaced apart so that they cannot come into contact with one another when the container is transported. The elastically deformable projections press the disks into the grooves and thus fix their relative positions. In the known container, the projections are in the form of lamellae which consist of a relatively small amount of material and whose resilience rapidly declines. Moreover, the thin lamellae can be easily broken off, so that the disks are then no longer adequately protected. This known container has an overall height which is approximately the same as that of the disks to be transported in it. However a disadvantage of this construction is that disks are difficult to insert into the container or box. Furthermore, the box is consequently difficult to clean. To facilitate cleaning, which is absolutely essential in such containers, the known container has a removable base. This makes the container in general expensive since three parts, i.e. the box, the cover and the base, are required, each part having a different form and having to be produced separately.

PCT Laid-Open Application WO 86/00746 discloses a container for thin articles, in particular FlexyDisks ® ( ® is a registered trademark of BASF Aktiengesellschaft), in which two externally identical container halves form a completely closed container provided with receiving elements for the FlexyDisks. The receiving elements are formed by elements which have an L-shaped cross-section and possess grooves for the edges of a FlexyDisk, the elements being arranged in each container half. Consequently, the distance between the individual FlexyDisks in each half is greater than it would be if each of the halves formed a single container. The halves can be connected to one another by joints. This container is purely an archive container and, because of its many individual parts, is likewise expensive to produce.

For the purposes of the present invention, disk-shaped articles can be any disk elements, e.g. printed circuits, wafers for integrated circuits, etc, or any type of disk-type or plate-shaped recording medium, such as magnetic disks, optical, magnetooptical or electrical storage disks for storing any desired information in analog, digital or video form. The purpose of a container of the type according to the present invention is illustrated below with reference to data storage disks.

Data storage disks, referred to below as disks for short, may be, for example, magnetic disks for electronic data processing units, which have a coated metal body. However, the disks may furthermore be other data media possessing a stiff, coated basic element, for example digital magnetic disks. The coating suitable for data storage is very sensitive, and the disks must therefore be handled very carefully at the manufacturing plant, during production, during transport from the manufacturing plant to the consumer, and also subsequently. Particular care must be taken to ensure that the sensitive coating is not damaged.

OBJECTS AND SUMMARY OF THE INVENTION

It is an object of the present invention to provide a container which effectively protects the disks to be enveloped or enclosed, while affording better accessibility, and has a wide range of uses.

We have found that this object is achieved by a container of the type defined at the outset if the base portion consists of two substantially identical parts which can be assembled, and two further, substantially identical cover parts are provided, each cover part partially or completely covering at least one opening in the base portion, and the locking means by means of which the two parts of the base element can be disengageably locked together being provided on at least one of the cover parts.

This provides a multi-purpose container which is equally suitable for transporting, storing, temporarily storing and removing very sensitive disks manually and mechanically, and is indispensable for the manufacturer and user of the disks.

A plurality of disks or individual disks can advantageously be removed by virtue of the fact that, for example, circular disks which are clamped at their outer diameters and can be gripped there are capable of being lifted out rapidly and without any danger of damage or soiling.

Because of the advantageous design of the container, as is also evident from the description below, the production costs of such containers can be substantially reduced.

It is advantageous if the novel container consists of a total of four parts. However, since pairs of these parts are very similar or substantially identical, only two different types of parts need to be produced. The manufacturing cost is therefore low, and only two different parts need be stocked. The container is easy to clean if the parts of the base portion have only about half the height of the container and the interior thereof is therefore easily accessible. The cover parts present no problems in terms of cleaning since they can be designed to be accessible from all sides.

Another advantage of this container is that a part can easily be replaced if it beocmes damaged, since the parts occur as at least substantially identical pairs.

In a practical embodiment, the cover parts are at least substantially L-shaped in side elevation, and each arm of the L-shape embraces one side of the base portion in side elevation. The cover parts are thus simple and economical to produce and easy to clean.

Furthermore, each arm of the L-shape can be provided with locking elements, in particular cut-outs, while the grasped lateral surfaces of the parts of the base portion can be provided with appropriate locking elements, in particular with projections. Thus, the two parts of the base portion can be connected simply by one cover part.

In a further embodiment, each of the arms of the L-shaped cover parts which closes one of the two openings of the base portion can be provided with article-holding means associated with the receiving grooves of the base portion. Consequently, the disks are held in a vibration-free manner when the container is closed. In practice, the article-holding means may be in the form of indentations or projections on the arm of the cover part.

In practice, the article-holding means may comprise one or more springy elements, in particular indentations in the cover part, having a substantially U-shaped or trough-shaped cross-section.

Advantageously, the receiving grooves in the parts of the basic element and/or the counterpieces of the article-holding means can have an at least approximately trapezoidal cross-section, so that the disks can be inserted without damage and can be stored with narrow tolerances. An advantageous embodiment is one in which the bottom of the receiving grooves in the parts of the base portion possesses substantially an arc-shaped surface, in particular an interrupted surface of this type.

In another embodiment which is advantageous in terms of production and for storing circular disks, the bottom of the receiving grooves may be in the form of a flat surface, in particular a plurality of surfaces separated from one another.

To permit better and space-saving handling, archiving and transportation, the parts of the base portion may be provided with stacking means, at least in the region of the two or more openings of the base portion.

The stacking means may be designed as wall sections of the parts of the base portion, the said wall sections being capable of interlocking in at least two dimensions.

In practice, the stacking means on the parts of the base portion can be arranged so that they are arranged symmetrically about the vertical central axis of the side elevation of two parts of the base portion stacked one on top of the other.

Advantageously, the stacking means may be congruent projections and depressions which are arranged so that the first of the parts of the two base portions, when rotated through 180° in the horizontal plane with respect to the other part of the base portion and through a further 180° in the vertical plane and placed on top of the other part of the base portion, causes the individual stacking elements to interlock. This gives good stackability while allowing the production of identical parts of the base portion.

In a practical embodiment, at least some of the stacking means may consist of sealing webs and grooves which may be provided on one or more edges of openings in a part of the base portion, parallel to the edge, so that there is a good seal at the parting joint, which ensures virtually complete shielding by virtue of the fact that at virtually no point is there a direct passage through the wall from the inside to the outside or vice versa.

In another practical embodiment, some or all of the stacking means can consist of contoured webs provided on the outer edge of the opening, and corresponding cut-outs, so that it is possible to stack the individual parts of the base portion even when the cover part is mounted.

If both the sealing webs and grooves and the contoured webs and cut-outs are used on the same part of the base portion, identical parts provide two possible methods of stacking, with different stacking elements pointing upward and downward. For better lateral support of the parts of the base portion stacked one on top of the other, it is possible to provide supporting elements which are offset by a distance corresponding to the wall thickness and are present in each case in the region of the cut-outs and project beyond the cut-out contour in height.

Advantageously, an inner opening edge may be provided parallel to the outer opening edge, the said inner opening edge being capable of being closed by the cover part, in particular in a hood-like manner, thus permitting closure of the opening or openings without loss of stackability.

The height of the cover part (L-arm) in the closed position is advantageously chosen to be smaller than the height of the contoured web or of the supporting elements. Consequently, the parts of the base portion are stackable even if they are closed on one side by the cover part and even when the cover part is lying in between. This improves handling and provides an excellent solution to the problem of storage and archiving space.

At least in that region of the wall which covers the opening of the parts of the base portions, the cover parts are advantageously narrower than the distance separating the long sides of the outer opening edge from one another.

The present invention furthermore relates to the advantageous embodiment of the container parts or supporting parts when the latter comprise an approximately rectangular or right parallelepipedal frame consisting of walls, two opposite walls having receiving grooves for the disk-shaped articles on their insides, and stacking means on at least one end edge for stacking a plurality of container parts one on top of the other.

BRIEF DESCRIPTION OF THE DRAWINGS

Embodiments of the invention will now be described by way of example with reference to accompanying the drawings in which FIG. 1 shows a front view of a closed container according to the invention, FIG. 2 shows a side view of the container of FIG. 1, partially cut away, FIG. 3 shows a section, taken on the line III—III of FIG. 2, through the container, FIGS. 14a and 14b show schematic side views (on a reduced scale) of two stacked complete containers in each case.

DETAILED DESCRIPTION OF PREFERRED EMBODIMENTS OF THE INVENTION

FIG. 1 shows a container for circular disks (e.g. recording disks), which consists of parts 1 and 2 of a base portion and two cover parts 3 and 4. In the assembled state, these four parts form a container which is closed on all sides. Parts 1 and 3 may be regarded as a base portion or box which can be closed by the cover consisting of parts 2 and 4. However, the terms box and cover may be redefined as desired, since they are identical here.

Figure 4:
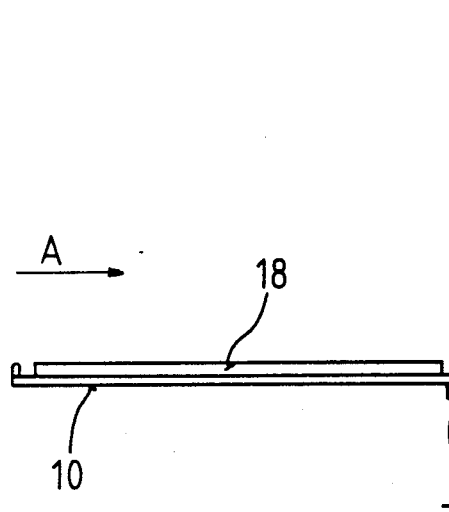
FIGS. 4 and 5 show the closure part of the container shown in FIGS. 1 to 3, FIG. 5 being a view of FIG. 4 in the direction of arrow A.

The base element part or carrier part 1 and the cover part or closure part 3 can be connected to one another, for example, by locking means in the form of a push-fit or of spring elements 5 and 6, in this case projections on the carrier part 1 projecting into recesses of the closure part 3. Carrier part 2 and closure part 4 can be connected to one another in the same manner. Closure part 4 and carrier part 1 can be connected to one another by means of elements 7 which lock under spring action. It is also possible for either elements 5 and 6 or element 7 to be springy. The embodiment of FIGS. 1 to 7 possesses a projection 8' which is mounted on the carrier part 1 and projects into a recess 19 of the closure part 4. The closure parts 3 and 4 have an approximately L-shaped cross-section (FIG. 4). They are advantageously produced from an elastically deformable plastics material, in particular a thermoplastics material, so that the arm of the L-form or the wall 9 or 9' can be bent through a total distance sufficient for it to project beyond the projection 8 or 8'. Because of their springiness, the walls 9 and 9' snap over the projections 8 and 8' and lock the parts 1 and 2 together. When both closure parts 3 and 4 are in their locking position, the four individual parts 1 to 4 are locked together, and the container is completely closed. The closure parts 3 and 4 may also consist of a tough and resilient plastics material, for example polypropylene, polyethylene or a polyester. To make the wall 9 or 9' more flexible, it may also be designed to be thinner than the wall 10 or 10' of the closure parts 3 and 4, the latter serving in this embodiment as a supporting surface for the container. The cover parts or closure parts 3 and 4 may also be produced from plastics material which has little or no resilience. It is also possible in principle for the cover parts 3 and 4 to be more or less flexible in different parts, for example by the provision of integral hinges, etc. These measures should, however, permit sufficiently secure locking and closing of the container parts in functional terms.

The base portion parts or carrier parts 1 and 2 may likewise consist of plastic material, for example, nylon, but may also consist of metal, a metal alloy, e.g. an aluminum or magnesium alloy, or of a ceramic material. These parts, like the cover parts or closure parts, should be produced by a mass production process, for example an injection molding, compression molding or sinter process.

Figure 7:
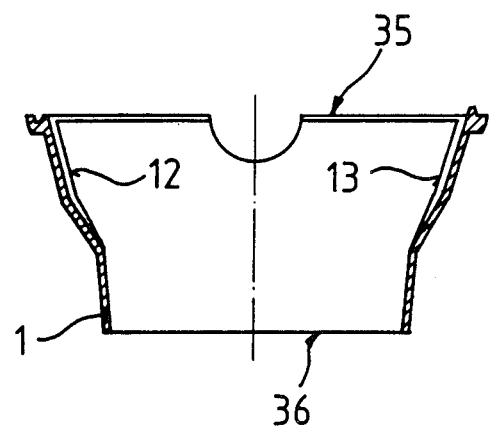

As shown in FIG. 1 to 3, the carrier parts 1 and 2 are about half the height of the container, so that two correctly combined carrier parts 1 and 2 substantially determine the height of the container. As can be seen in FIG. 7, the carrier parts 1 and 2 are substantially in the form of a frame, with large openings 35, 36 on two sides opposite one another. This makes the carrier parts 1 and 2 particularly easy to clean. Moreover, when the height of the carrier parts 1 and 2 is approximately the same as the disk radius r, the disks 16 can easily be inserted into these parts and removed from them again, for example manually at the outer edge of the disk 16 or mechanically at the inner edge of the opening 39 of the disk 16. Thus, introduction and removal may also be effected automatically in a very simple manner.

Figure 9:
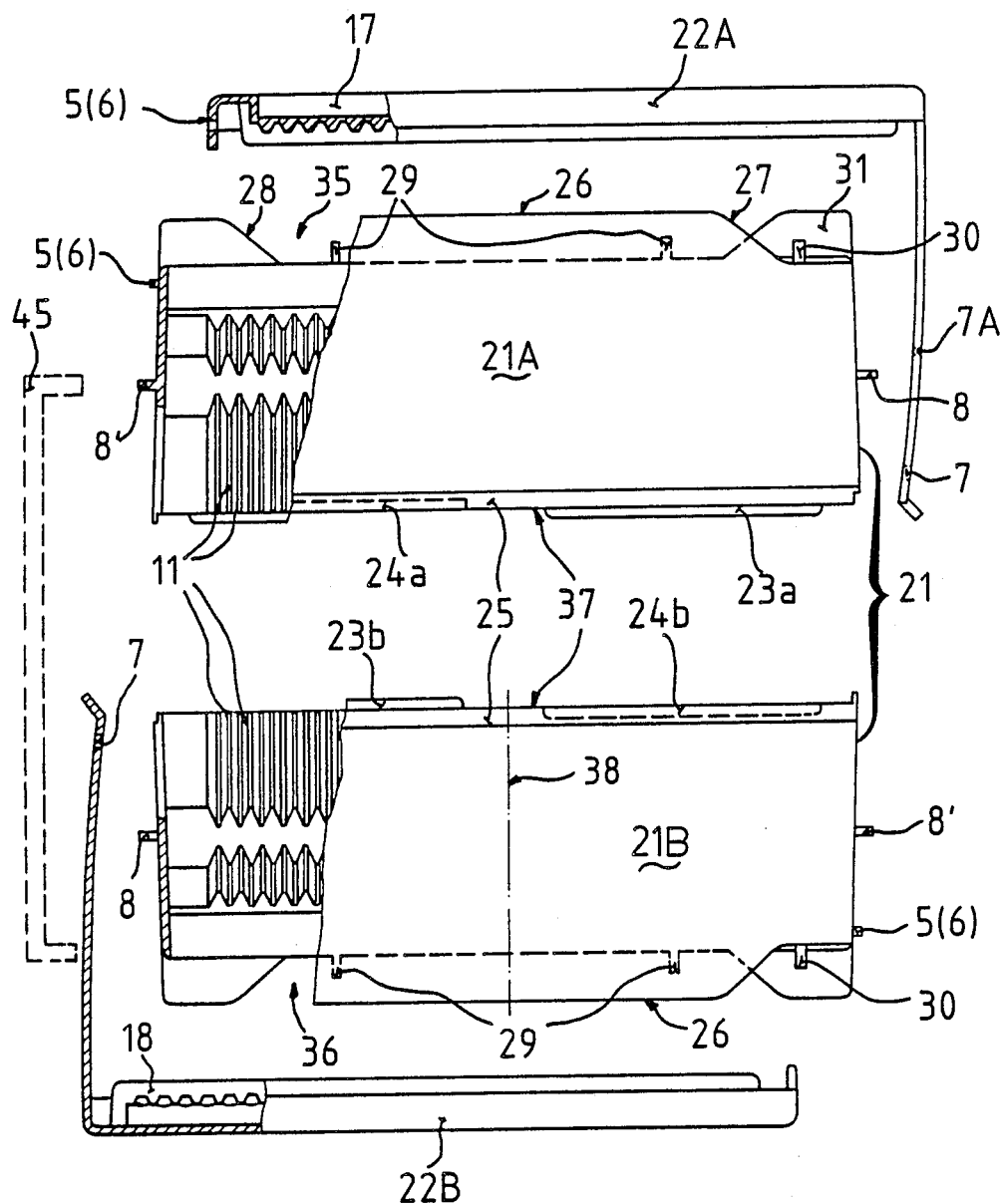
FIG. 9 shows, in side view, the individual parts of the container shown in FIG. 8.

The supporting parts 1 and 2 contain a large number of article-receiving grooves 11 (cf. FIG. 9). The grooves 11, which may be arc-shaped, are not continuous here but, in the case of the carrier part 1 shown in FIG. 7, are present in, for example, two projections 12 and 13 of the supporting part. The grooves 11 need not have curved bottom surfaces but may, instead, be flat and straight, so that the disks 16 do not make contact with the bottom of the grooves 11 along a line but instead only make point contact. The carrier part 2 has corresponding projections 14 and 15. It is important that the grooves 11 are sufficiently deep in order to hold the disks 16, indicatedby the dot-dash line in FIG. 3, so that they cannot become displaced in the transverse direction. The grooves advantageously have an approximately trapezoidal cross-section (cf. for example FIG. 9).

The disks 16 are thus fixed in their position in the container by the grooves 11 and, provided that the grooves 11 are not too narrow, the disks 16 are not damaged. Such damage to the coating of the disks 16 can be avoided if the disks are held relatively loosely in the grooves 11. Otherwise, the stability of the disks in the lateral direction is a question of the height or depth of the grooves 11, which in any case can be chosen so that adequate stability can be achieved for the individual disk or the plurality of disks, even without further article-holding means. The latter statement applies in particular to disks which, when introduced into the container, must not be damaged, or must no longer be damaged, for example substrate plates for magnetic recording media, optical media, optical disks, circuit boards, wafers, gramophone disks, etc.

Disks 16 which possess a sensitive layer have to be better supported or fixed, e.g. in every direction. For this purpose, it is possible to provide, on the closure parts 3 and 4, indentations or projections 17 and 18 which, when the container is closed, project into the latter and come into contact with the upper edge of the disk periphery. These indentations 17 and 18 serve to hold the disks 16 on both sides. Each indentation 17, 18 may furthermore be springy, so that it rests against the peripheral edge of the disks 16 under pressure. The disks 16 are then clamped between two indentations 17 and 18 and are pressed against the bottom of the grooves 11.

One or more such indentations 17 or 18 may be present in each closure part 3 or 4 and are advantageously arranged approximately in the middle, although they may furthermore be present in a non-central position. However, they should always be located diametrically opposite one another, relative to the disks 16. It is also possible for two or more indentations or projections to be present on each closure part.

The projections may also be in the form of thicker areas of material. They may be rigid, for example when the wall 10 itself provides little resilience.

Each indentation 17 or 18 may be continuous, and its cross-section may be matched with the peripheral contour of the disks 16. As shown clearly in FIG. 2, it is also possible and advantageous for the indentations 17, 18 to be in the form of a plurality of transverse ribs 32, whose spacing and shape can be matched with those of the grooves 11.

In principle, the disks 16 are pressed against the bottom surface of the grooves 11 by means of any of the indentations 17 or 18, so that the disks 16 are also temporarily fixed. Although this function could be adequately performed in principle if, for example, only the projection 17 were present and the closure part 3 had not projection, it would then be necessary to produce and employ two differently shaped closure parts per container, making the latter more expensive. Moreover, greater security against lateral displacement of the disks 16 is achieved with two projections 17 and 18 opposite one another.

However, it is possible to produce the closure parts 3 and 4 with the same shape but from different materials, so that, for example, only one of the indentations may be springy.

The transverse ribs 32 are in the form of bulges on the walls 10 and 10'. They have a roughly V-shaped cross-section. When laying firmly against the peripheral surface of the disks 16, the transverse ribs 32 may be elastically compressed so that their cross-sectional shape is altered. The wall thickness of the ribs 32 may be smaller than the remaining wall thickness of the closure parts 3 and 4.

The container is assembled, for example, as follows.

Figure 5:
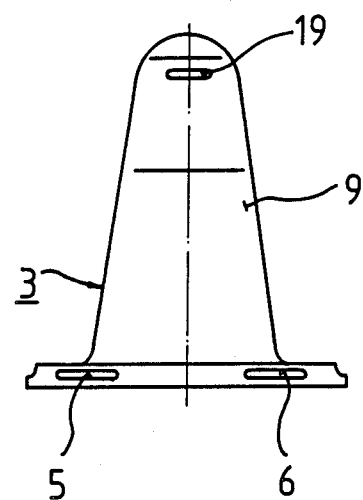

First, the carrier part 1 and 2 are inserted into the closure parts 3 and 4, the locking elements 5 and 6 engaging one another. The cover and box are thus complete. They are combined to form the container by rotating the upper half, which consists of parts 2 and 4, through 180° and placing it on top of the base portion or box, which consists of parts 1 and 3. The walls 9 and 9' are bent outwards so that they can overlap the projections 8 and 8'. When the carrier parts 1 and 2 lie firmly one on top of the other, the walls 9 and 9' are released so that the projections 8 and 8' engage, or snap into, their recesses 19 (FIG. 5). The container is thus closed. If necessary, the disks 16 are inserted, for example, into the carrier part 1 before the container is closed.

The example of a container which has been described possesses the following features:

the box and cover are designed as at least substantially identical parts which complement one another to form a closed container, the box and cover each consist of an inner carrier part 1, 2 possessing grooves 11, and an outer closure part 3, 4 which has an at least approximately L-shaped cross-section.

the carrier parts 1, 2 can be inserted into the closure parts 3, 4 and can be connected to these by pushfit elements 5, 6 mounted at one or more points.

the indentations 17, 18, which may or may not be elastically deformable, are mounted, in particular, on the two closure parts 3, 4.

when the container is closed, the two carrier parts 1, 2 lie firmly against one another while the closure part 4 of the cover can be fixed to the carrier part 1 of the box, and vice versa, by locking elements 8, 8', and the indentations 17, 18 may possess grooves or ribs 32 whose distance apart corresponds to the spacing of the centers of the grooves 11, and which are at least substantially opposite the grooves 11 of the carrier part.

One of the advantages of this container is the form of the indentations, which may or may not be resilient and which, for example, are designed as a continous bulge in one wall of the closure parts. These indentations or projections thus form part of the wall of the closure parts, so that they are relatively insensitive and are not easily damaged. They can be provided with any necessary elastic deformability by giving them the appropriate shape. In the case of a closed, full container, they may be pressed against the disks when placed in position. Thus, the disks can be constantly pressed into the grooves and can therefore be held in their position securely and so that they cannot slip.

FIGS. 8 to 14 show a further embodiment of a container 20 according to the invention which possesses base portion parts 21 A and B, referred to below once again as carrier parts, and cover parts 22 A and B, referred to below once again as closure parts. The carrier parts 21 A and B are of the same form, which means that the two parts should be capable of being produced from the same molds, as in the case of the container of FIGS. 1 to 7 too. In one position (next to one another, facing in the same direction and with the same form in the vertical direction), the carrier parts 21 A and B are very similar or, in the limiting case, even identical. From the position described, for example, part 21 A can be rotated through 180° with respect to part 21 B and can be mounted on top of part 21 B by rotation through a further 180° in the vertical plane, producing the two-part base portion 21 which has the openings 35 and 36 above and below (FIG. 9). Associated with the carrier parts 21 A and B, or the base portion 21, are the closure parts 22 A and B, which, if necessary, may also be designed as two separate parts but together may form a single part, for example a first, common wall for closing both openings 35 and 36 and a connecting wall on only one side. The form of closure parts 22 A and B substantially corresponds to that of parts 3 and 4 in FIGS. 1 to 7, with the possible exception of a trapezoidal cross-sectional form instead of the triangular shape of the ribs 32 in FIG. 2. Parts which are substantially the same are also denoted by the same reference symbol below.

Closing container 20 produces a parting joint 33 which essentially is covered at least laterally and is formed by virtue of the fact that the sealing webs 23a and b and sealing grooves 24a and b, which for example run along the periphery, engage one another and interlock in three dimensions. The sealing webs and grooves 23 and 24 are part of the stacking means of this container and are provided at the edge 25 of each supporting part 21 A and B. The edge 44 is the peripheral edge of each part 21 A or 21 B and defines the opening 37 of each part. Thus, when carrier parts 21 A and 21 B are inserted one into the other by means of the sealing webs and grooves 23 and 24, the openings 37 lie one on top of the other.

The sealing webs 23 and sealing grooves 24 are arranged on the opposite side edges 25 of the opening 37 of each carrier part in alternate arrangement with respect to the central vertical axis 38, FIG. 9. Thus, on the left, (FIG. 9), of vertical axis 38 the lower carrier part 21B has a sealing web 23*b* and on the right of the axis the carrier part has a sealing groove 24*b*. Similarly the upper carrier part 21A, when placed on top of the lower carrier part 21B in the proper inverted relationship, has a sealing groove 24*a* on the left of vertical axis 38 and a sealing web 23*a* on the right of this axis.

Relative to this position of carrier part 21 B, the carrier part 21 A must therefore first be rotated in the horizontal plane (at right angles to the plane of the drawing) and then in a vertical plane (in the plane of the drawing) in order to achieve an arrangement which permits the supporting parts 21 A and B to be combined. However, it is also possible to provide, to the right and left, a web 23 and a groove 24 parallel to one another so that the webs 23 and the grooves 24 are diagonally opposite one another. The rotations (through an angle of 180° in each case) are then likewise carried out as described above.

On its lower side, the carrier part 21 B has the opening 36, which is covered by the outer edge 26. The outer edge or the opening edge 26 is likewise provided with stacking means, which consist of contoured webs 27 and corresponding cut-outs 28. Carrier part 21 A has corresponding contoured webs 27 and cut-outs 28 on its upper side, in particular on the outer opening edge 26. After rotation through 180° in a horizontal plane, carrier part 21 B can be placed on top of carrier part 21 A. A plurality of base portions 21, consisting of the combined carrier parts 21 A and 21 B, can also be stacked vertically.

Figure 10:
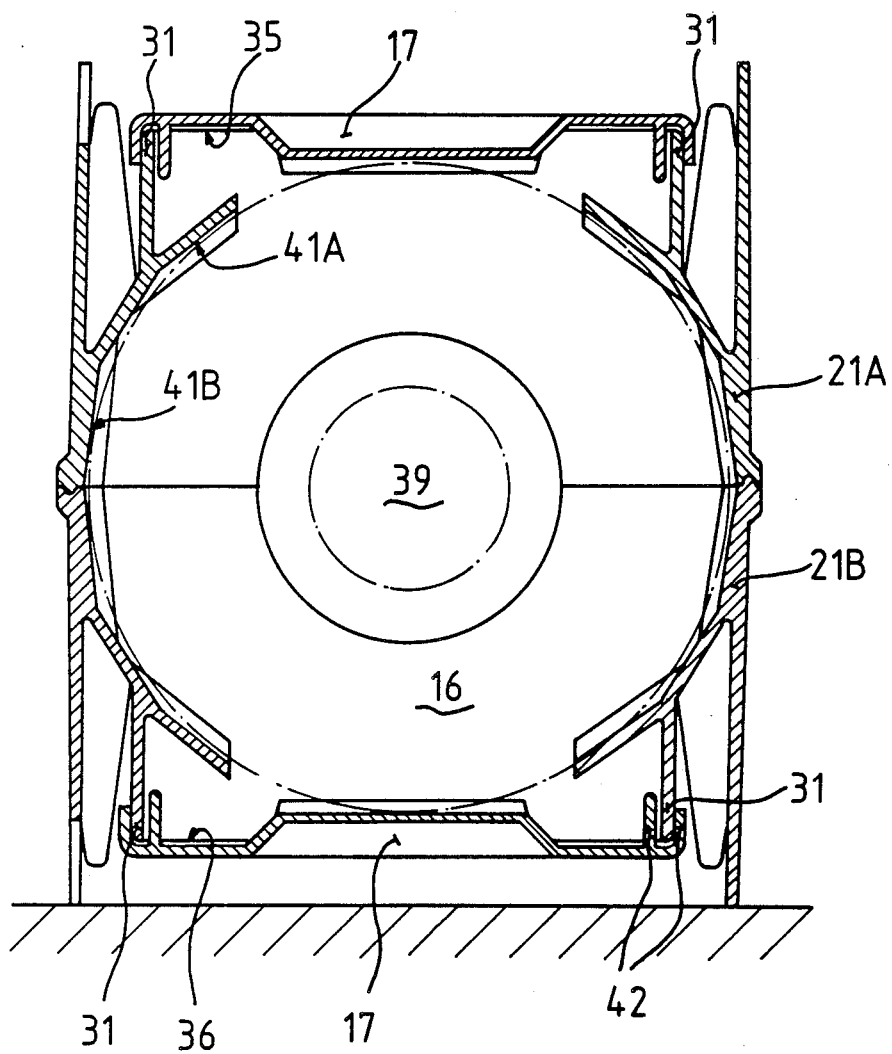
FIG. 10 shows a cross-sectional view taken on the line X—X of FIG. 8.

FIG. 10 shows, in cross-section, that an inner edge 31 is provided which runs directly around the openings 35 and 36. The cover part 22 A or 22 B is inverted over this inner edge 31, a secure closure being achieved when, as illustrated, the height of the cover part 22 A or 22 B in the closed position is smaller than the height of the contoured web 27 and any further supporting elements; thus, each carrier part 21 A or 21 B provided with a cover part 22 A or B can be stacked individually, or the entire base unit complete with two covers can be stacked (cf. FIG. 13). Here, it is also clear that the one cover wall which serves to lock the cover part 22 may be narrower than the dimension a of the long sides of the outer opening edge 26 of each supporting part 21 A or 21 B. It is important that the circular axial opening 39 formed by two stacked carrier parts 21 A and 21 B is closed when the cover part is in the closed position.

Figure 13:
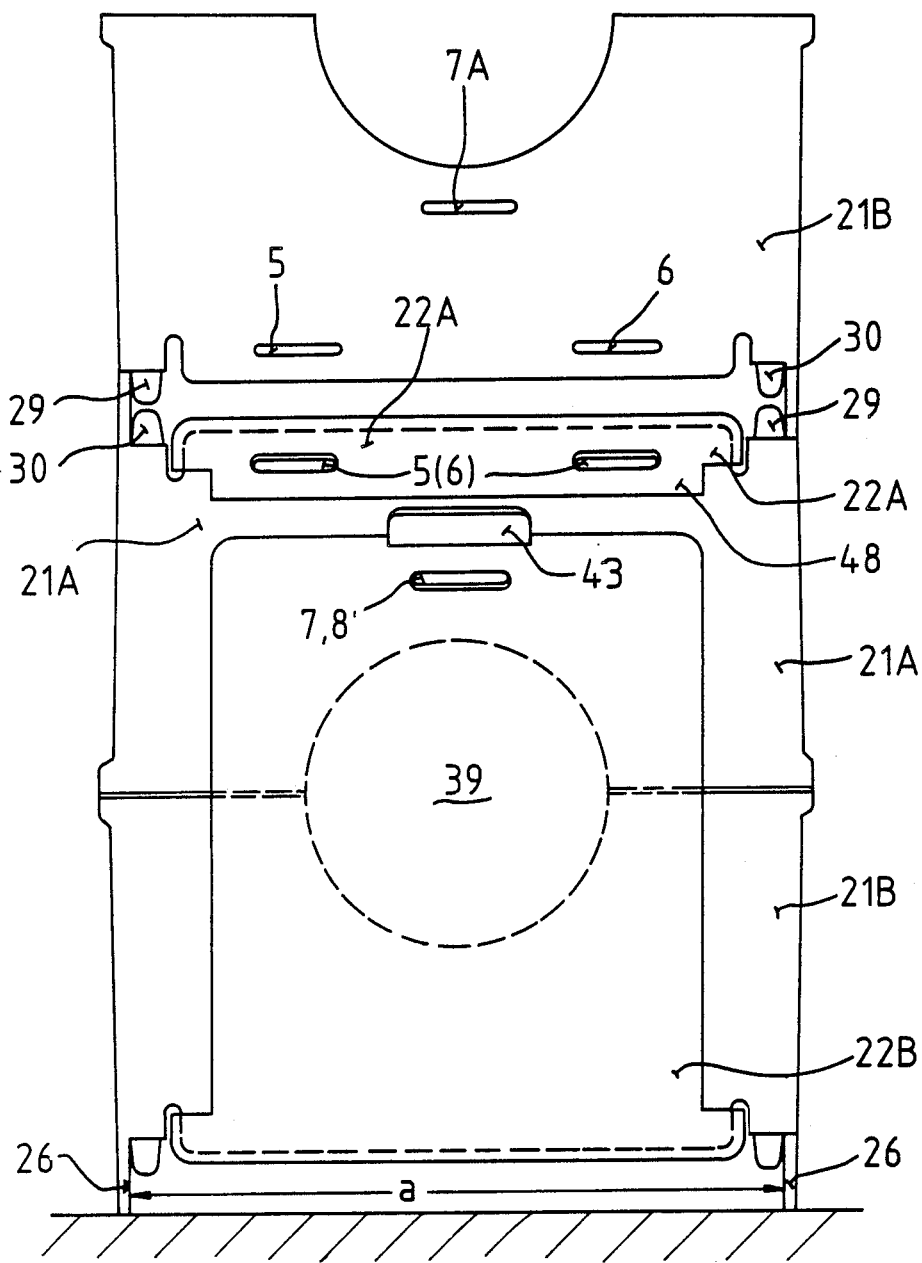
FIG. 13 shows a front view of a complete container, including the cover parts and a further part of the base portion mounted on top.

Particularly with regard to lateral relative movements of stacked supporting or container parts, it is advantageous to provide supporting elements which, for example, are offset by a distance corresponding to the wall thickness, are present in each case in the region of the cut-outs 28 and project in height beyond the cut-out contour 28. Such supporting elements are the ribs 29, 30, which are arranged at right angles to the wall at the edge 26. As shown in FIG. 13, the ribs 29 and 30 of the carrier parts 21 B and 21 A are about half the height of the end parts of the cut-out contour 28.

However, where additional supporting elements are required when the individual carrier part is placed in position, it is also possible for the heights of the ribs 29, 30 and of the end parts of the cut-out contour 28 and of the contoured web 27 to be matched with one another, particularly when the arrangement (cf. FIG. 8) is such that, in the stacked position, the ribs 29 are inserted between the ribs 30, or vice versa, or are displaced with respect to one another in some other way.

In FIG. 9, parts of the walls of the carrier part are cut away in order to show the receiving grooves 11, which in this case are in the form of partial grooves, each groove 11 advantageously possessing a trapezoidal cross-section. Any grooves 40 which may be present advantageously also have a trapezoidal cross-section. The bottom of the grooves 11 may be circular or straight, for example in the form of tangents 41 A, 41 B in FIG. 10. In this representation, the bottom of each groove 11 is in the form of a flat surface or surface sections separated from one another.

FIG. 10 shows that, in order to provide a better seal, the peripheral edge 42 of the cover parts 22 A and B is in the form of a double edge, which holds the edge of the inner wall between its two parts and seals it on both sides. Each cover part is locked together with one or two carrier parts 21 A and/or 21 B by means of recesses and projections (5, 6, 7, 8, 8', 19) which may be present both on the end parts of the cover parts 22 and on the end surfaces of the carrier parts 21 A and B.

Figure 8:
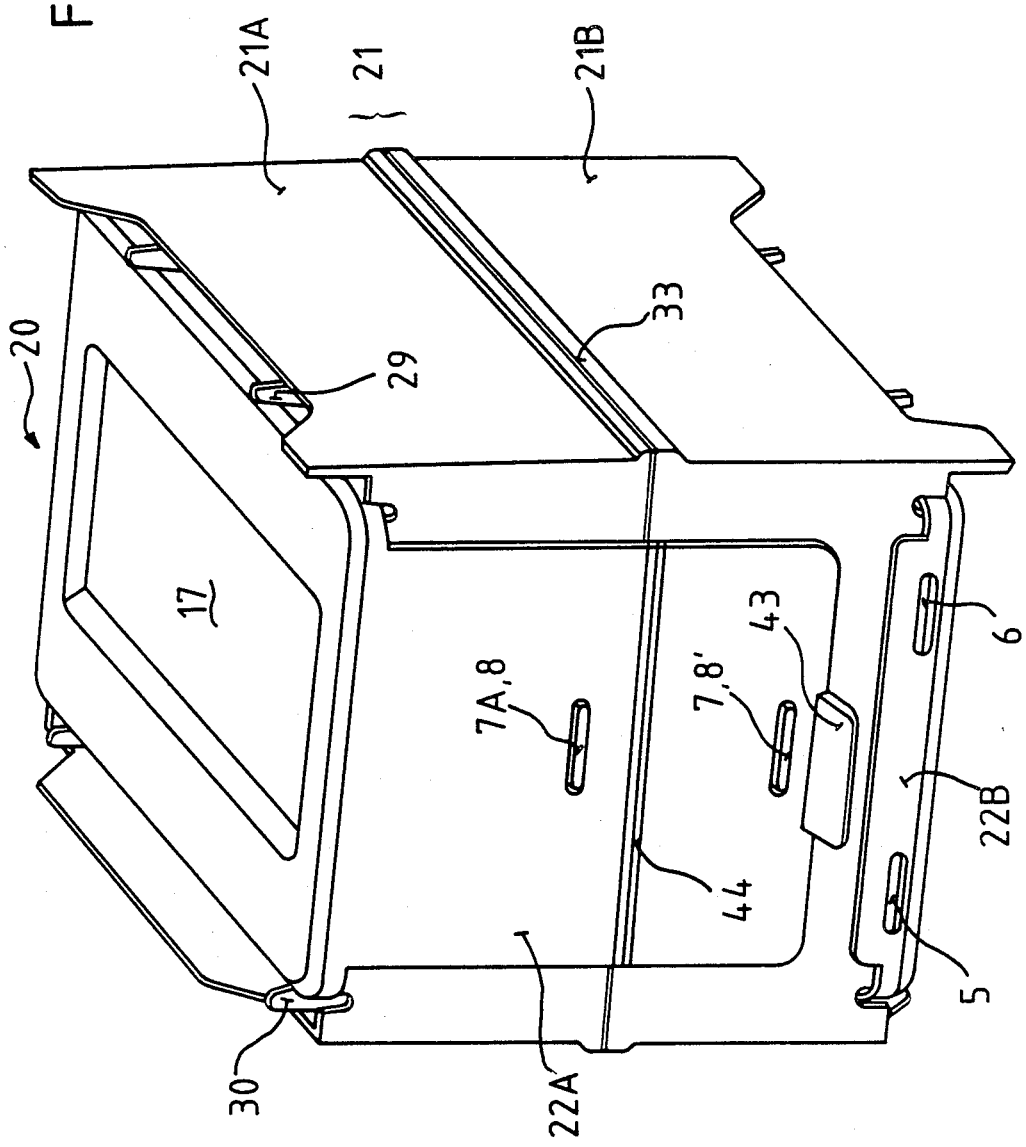
FIG. 8 shows another embodiment of a container according to the invention.

Another recess/projection combination 7 A can, if required, additionally be provided on the same carrier part 21 A or 21 B, for example in the region of the opening 39 of the part; this favors a carrier part/cover part unit (cf. FIG. 8). A gripping lug 43 facilitates both locking and release of the locking elements. In order to increase the flexibility of the narrow wall of the cover part 21 A, 21 B, it may be advantageous to provide an integral hinge 44 roughly at the height of the edge 34 of the carrier part 21 A or 21 B. In this case too, the flexibility of the material should not be expected to meet excessively high requirements.

In principle, it is also possible to replace the cover parts 22 by two U-shaped brackets 45 which may be flexible, and this is indicated on one side in FIG. 9. This can be done when, for example, the carrier parts 21 A and B are to be left uncovered and, for example, handled mechanically.

Because of the large number of figures, a short description of the individual figures is given again below.

FIGS. 1 and 3 show a generally circular container, viewed from the end face and in cross-section, respectively.

FIGS. 2 shows the same container in side view, partly cut away and showing a number of disks present therein.

FIGS. 4 and 5 show a side view and front view, respectively, of a closure part or cover part.

Figure 6:
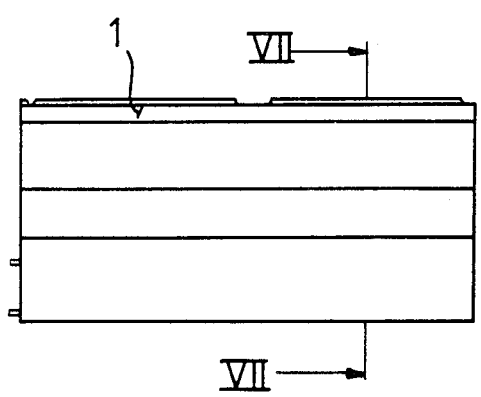
FIGS. 6 and 7 show the carrier part of the container shown in FIGS. 1 to 5, FIG. 7 being a section on the line VII—VII of FIG. 6.

FIGS. 6 and 7 show a side view and cross-section of a carrier part,

FIGS. 8 to 14 show a container which has a squarer shape, these figures specifically illustrating the following:

FIG. 8: Two almost completely identical container halves can be inserted one into the other after rotations through 180° and form a container together with two covers, which likewise are almost completely identical, for closing openings in the outer and front surfaces of the base portion and for locking all parts together. The container is used for packinging and/or transporting a number of disk-shaped articles.

FIG. 9: A detailed illustration of the container. The edges 34 of the two carrier parts are provided with webs (23) and grooves (24) opposite one another, which ensure that the upper and lower carrier parts are positioned precisely and undisplaceably with respect to one another.

FIG. 10 shows that the carrier parts possess a double wall on the long sides. When the part is used as a lower part, the two outer edges serve as supports, whereas when it is used as an upper part, the said edges serve to hold a further container placed on top.

Figure 11:
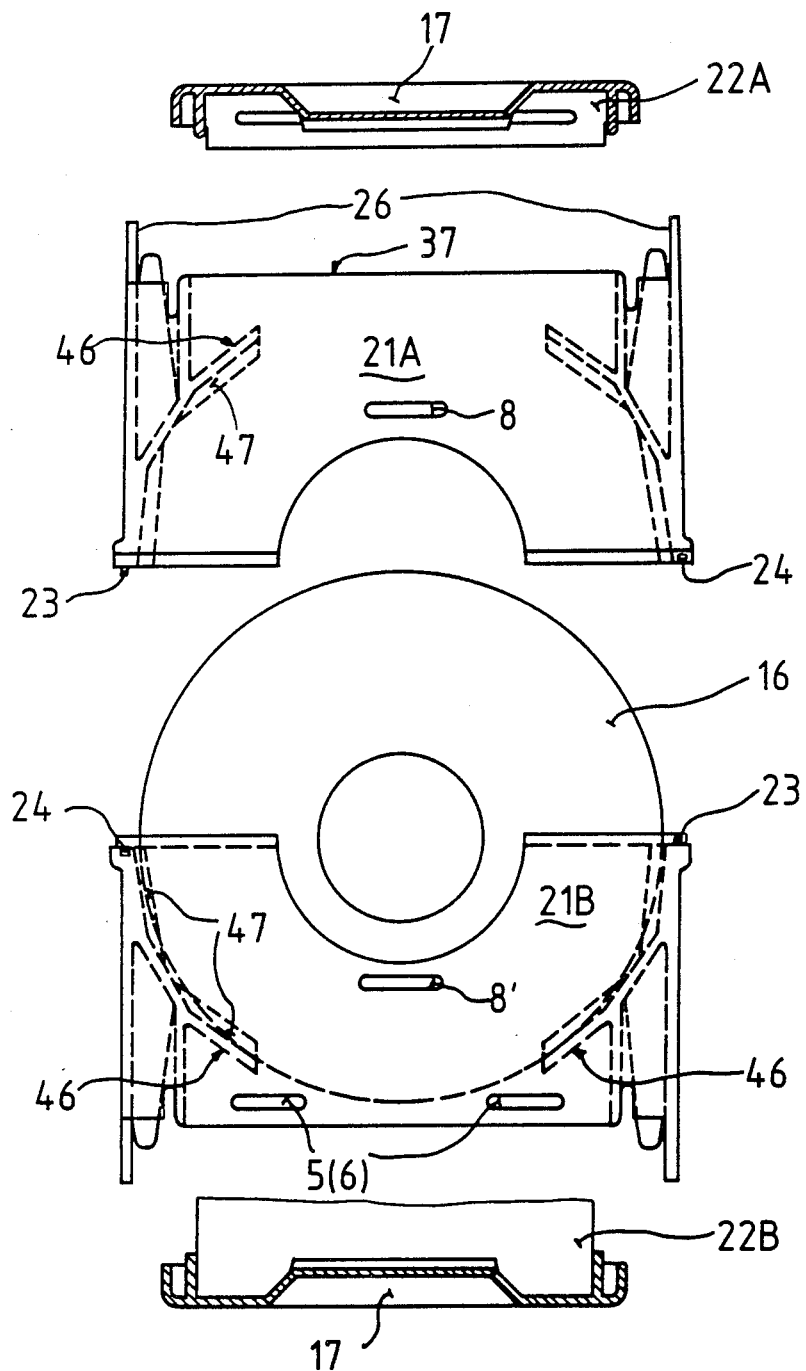
FIG. 11 shows, in front view, the individual parts of the container shown in FIG. 8.

FIG. 11: In the exploded front view showing the individual parts, the openings required for mechanical removal of the disks are clearly visible in the front faces and above and below. The covers fit into the peripheral edge of the rectangular openings, whose sides are formed by the front walls and the inner walls at right angles. When the upper carrier part is removed, the disks, which project halfway out of the lower part, can be removed individually, in any order and without difficulty, by clasping them at the outer edge. The lower cover need be removed only where removal is effected mechanically.

Figure 12:
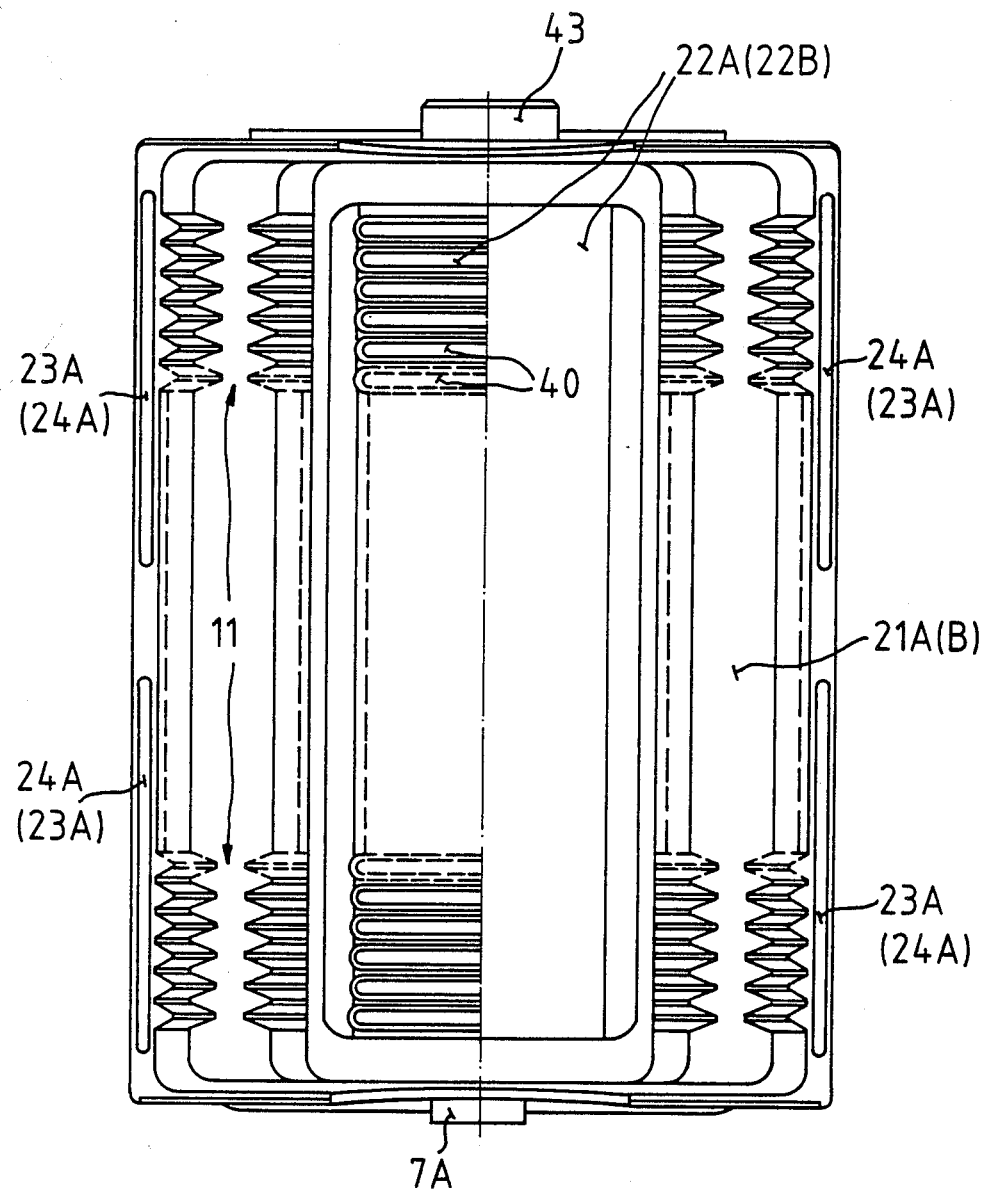
FIG. 12 shows a plan of a part of the base portion, with a cover part arranged underneath, of the container shown in FIGS. 8 to 11.

FIG. 12 shows a plan of a lower part of a container (lower carrier part) with a cover. The cover is shown in two embodiments (separated by the longitudinal central axis). It may have a smooth surface (right-hand) or possess additional grooves (left-hand). In the first example, additional edge contact elements may be required at the periphery of the disks.

FIG. 13 shows a front view of a complete container with covers, on top of which a carrier part (lower part) of another container (without a cover) is placed. Container parts can be stacked with or without cover parts. Sufficient space for the cover parts remains between two containers mounted one on top of the other. The containers are supported and locked in position only at the outer side walls. The covers are arranged inside the side walls, a certain distance away from the latter.

FIG. 14a and b are two side views (right and left, respectively, relative to the view in FIG. 13) of a plurality of containers placed one on top of the other.

The cross-section of the interior of the two carrier parts is matched with the particular disk periphery, i.e. each carrier part forms a circular or predominantly, as illustrated, polygonal half-shell which is shaped to correspond to the outline (in the example the diameter) of the disks and is interrupted below and above. In the carrier parts 46 of the periphery, comb-like projections 47 serve to keep the disks apart.

The two carrier parts together enclose the disks on both sides over a wide angular range, and the disks are thus secured on all sides without any play.

The inner walls below and above the disks run vertically downward when viewed in cross-section and, together with the two head walls at right angles form open rectangles (opening 37), which can be closed with the appropriate covers, and the container parts can be stacked with or without covers. The peripheral cover edge is provided, on both head ends, with fastening lugs 48, which are higher in relation to the long sides.

One or more slots (5, 6, 7, 7A, 19) in the two fastening lugs 48 and in the other closing parts engage corresponding projections (5, 6, 8, 8', 7A) provided on the upper and lower carrier parts, to effect closing and locking. Consequently, cover parts and carrier parts are firmly connected to one another and thus form a closed container.

To open the container and to remove the cover, the flexible long head ends of the cover parts are removed from the holding projections by pulling them.

The claims also relate to alternative embodiments to those described in detail.

For example, instead of the webs and grooves, pins and holes may also be provided for connecting upper and lower parts of a container so that they are positioned precisely with respect to one another. Furthermore, in order to lock the cover parts to the carrier parts, clip or snap connections, or bolts and holes, may be provided, instead of the webs and slots.

We claim:

1. A container for a plurality of disk-shaped articles, in particular recording media, said container comprising a number of superposed component portions,
    wherein said component portions are in the form of
        a pair of interchangeably identical part-shell shaped carrier portions each having on the inside of said carrier portion a plurality of grooves for receiving said disk-shaped articles and each having at vertically opposed ends first and second openings, respectively, said carrier portions, when assembled with their second openings facing each other, forming a composite shell, and
        a pair of, likewise interchangeably identical cover portions for respectively closing said first openings,
    means being provided for disengageably locking said cover portions and said part-shell shaped carrier portions together.

2. A container as claimed in claim 1, wherein said carrier portions in side elevation are of substantially rectangular shape and wherein the cover portions in side elevation are L-shaped, one arm of each L-shaped cover portion extending along the outside of the corresponding end, viewed in horizontal direction, of said carrier portions to form an element of said locking means.

3. A container as claimed in claim 2, wherein other cooperating locking elements are formed in the ends, viewed in horizontal direction, of said part-shell shaped carrier portions, and wherein said one arm of each cover portion in the locking position, engages said cooperating locking element in the end, viewed in horizontal direction, of the carrier portion which is non-adjacent to said cover portion, thereby locking said two part-shell shaped carrier portions to each other and to said cover portion.

4. A container as claimed in claim 3, wherein the locking means of said cover portions have recesses and the ends, viewed in horizontal direction, of said carrier portions have corresponding projections engaging said recesses.

5. A container as claimed in claim 2, wherein the other arm of each cover portion which closes the first opening of the corresponding part-shell shaped carrier portion has means for engaging said disk-shaped articles.

6. A container as claimed in claim 1, wherein stacking means are provided on said part-shell shaped carrier portions in the area of their first opening.

7. A container as claimed in claim 6 wherein wall sections of said part-shell shaped carrier portions are provided with stacking means affording an interlock in at least two dimensions.

8. A container as claimed in claim 6, wherein the stacking means of each part-shell shaped carrier portion are arranged symmetrically about the central vertical axis of each composite shell.

9. A container as claimed in claim 6, wherein said stacking means are arranged so as to interlock when one of said part-shell shaped carrier portions is placed on top of another, with the first openings of said two carrier portions facing each other and the two carrier portions being displaced with respect to each other about their common vertical axis by an angle of 180°.

10. A container as claimed in claim 1 wherein interengaging sealing webs and sealing grooves are provided on two opposite side edges of the second openings of said part-shell shaped carrier portions.

11. A container as claimed in claim 6 wherein said stacking means are in the form of contoured webs and corresponding cut-outs on the outer edge of the first opening of said part-shell shaped carrier portions.

12. A container as claimed in claim 11 wherein the width of each cover portion, in the area of said cover portion covering the first opening of the corresponding part-shell shaped carrier portion is smaller than the spacing between the long sides of the outer edges of the first opening of the part-shell shaped carrier portion.

13. A container as claimed in claim 12, wherein an inner edge extending parallel to said outer edge is provided about the first opening of said part-shell shaped carrier portions, the cover portion having lips, and when placed over said first opening, engaging said inner edge by means of said lips.

14. A container as claimed in claim 13, wherein elements for locating said carrier portions are provided inside said outer edges in the area of said cut-outs, said locating elements extending in height above the bottom level of said cut-outs.

15. A container as claimed in claim 11, wherein the height of each cover portion as placed in position over the corresponding part-shell shaped carrier portion is smaller than the height of the contoured webs of said carrier portion.

16. A container as claimed in claim 5, wherein said article-engaging means include a resilient element of trough-shaped cross section formed on said other arm of the L-shaped cover portion.

17. A container as claimed in claim 16, wherein said resilient element is formed by an indentation of said cover portion.

18. A container as claimed in claim 1 wherein the article-receiving grooves of said part-shell shaped carier portions have an approximately trapezoidal cross section.

19. A container as claimed in claim 1 wherein the receiving grooves have a linear bottom.

20. A container as claimed in claim 6 wherein said stacking means are formed so that said part-shell shaped carrier portions can be stacked with as well as without said cover portions in place.

* * * * *

UNITED STATES PATENT AND TRADEMARK OFFICE
CERTIFICATE OF CORRECTION

PATENT NO. : 4,779,732
DATED : Oct. 25, 1988
INVENTOR(S) : Boehm et al.

It is certified that error appears in the above-identified patent and that said Letters Patent is hereby corrected as shown below:

Title page Insert

-- [30] Foreign Application Priority Data
Jul. 9, 1985 [DE] Fed. Rep. of Germany ... 3524419
Apr. 2, 1986 [DE] Fed. Rep. of Germany ... 8608826 --

Col. 13, line 14 "1" should be -- 6 --

Col. 14, line 22 "carier" should be -- carrier --

Signed and Sealed this

Twenty-eighth Day of March, 1989

Attest:

DONALD J. QUIGG

*Attesting Officer*  *Commissioner of Patents and Trademarks*